(12) United States Patent
Imai (10) Patent No.: US 7,393,207 B2
(45) Date of Patent: Jul. 1, 2008

(54) WAFER SUPPORT TOOL FOR HEAT TREATMENT AND HEAT TREATMENT APPARATUS

(75) Inventor: Masayuki Imai, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 361 days.

(21) Appl. No.: 10/549,805

(22) PCT Filed: Mar. 22, 2004

(86) PCT No.: PCT/JP2004/003858

§ 371 (c)(1),
(2), (4) Date: Sep. 19, 2005

(87) PCT Pub. No.: WO2004/086496

PCT Pub. Date: Oct. 7, 2004

(65) Prior Publication Data

US 2007/0006806 A1 Jan. 11, 2007

(30) Foreign Application Priority Data

Mar. 26, 2003 (JP) ............................ 2003-085137

(51) Int. Cl.
*F27D 5/00* (2006.01)
(52) U.S. Cl. .................... 432/259; 211/41.18; 118/728; 118/729
(58) Field of Classification Search ................. 432/253, 432/258, 259; 211/41.18; 148/527; 118/724, 118/725, 728, 729
See application file for complete search history.

(56) References Cited

U.S. PATENT DOCUMENTS

| 6,099,302 A | * | 8/2000 | Hong et al. ................. 432/259 |
| 6,953,338 B2 | * | 10/2005 | Kreiser et al. ............... 432/259 |
| 7,204,887 B2 | * | 4/2007 | Kawamura et al. .......... 118/725 |

FOREIGN PATENT DOCUMENTS

| JP | 02-139935 | 5/1990 |
| JP | 07-161654 | 6/1995 |
| JP | 08-107081 | 4/1996 |
| JP | 09-129567 | 5/1997 |
| JP | 2000-91406 | 3/2000 |
| JP | 2002-164300 | 6/2002 |

OTHER PUBLICATIONS

International Search Report.

* cited by examiner

*Primary Examiner*—Gregory A Wilson
(74) *Attorney, Agent, or Firm*—Rader, Fishman & Grauer PLLC (57) ABSTRACT

The present invention provides a wafer support tool for heat treatment easy in working and capable of realizing reduction in cost without generating damages or slip dislocations that would be otherwise caused by high temperature heat treatment and a heat treatment apparatus. The present invention is directed to a wafer support tool for heat treatment comprising: a plurality of wafer support members for supporting a wafer to be heat treated; and a support member holder for holding the wafer support members, wherein the wafer support members each has a contact portion with the wafer, at least one of the contact portions being movable relative to the support member holder.

15 Claims, 14 Drawing Sheets

FIG.10 a) Sphere　　b) Ellipsoid　　c) Solid cylinder or Hollow cylinder

WAFER SUPPORT TOOL FOR HEAT TREATMENT AND HEAT TREATMENT APPARATUS

TECHNICAL FIELD

The present invention relates to a wafer support tool used in heat treatment of a wafer such as a semiconductor wafer, for example a silicon wafer, and to a heat treatment apparatus.

BACKGROUND ART

In a wafer support tool used for batch type heat treatment, there has been generally adopted a design that plural wafers are inserted and held in parallel to one another in grooves of a structure called a boat, which has support poles with the grooves. Especially in heat treatment at 1000° C. or higher, SiC is generally adopted as material of a wafer support tool because of its heat resistance and other properties. A method is adopted to cut grooves directly in the support poles with a diamond cutter or the like.

Since limitation is, however, placed on a shape of a work piece in this method, it is difficult to work the work piece into an intricate shape such as a curved surface. There also arises a problem that burrs are easily generated on surfaces of the grooves during cutting operation. In addition, there arises a problem that difficulties are encountered in additional working for removing the generated burrs and in polishing for decreasing surface roughness of the grooves with which a wafer is brought in contact, so damages or slip dislocations occur on wafers in the contact portions with the boat during heat treatment (see JP-A 7-161654 and 8-107081). Since the support poles are easy to be broken during working, which requires great labor and a working time, leading to poor productivity and difficulty in cost reduction.

The batch type heat treatment is to heat treat many wafers at a time using resistance heating (with a heater). In recent years, in addition to the batch type heat treatment apparatus, there also has been used frequently an RTP (Rapid Thermal Processing) apparatus for single wafer treatment in which rapid heating and rapid cooling treatment is performed by the use of a lamp heating method or the like.

Examples of heat treatment using an RTP apparatus can include: heat treatment for annihilating defects on a wafer surface, heat treatment for annihilating oxygen donors, heat treatment for producing a shallow diffused layer (RTA: Rapid Thermal Annealing), heat treatment for producing a thin oxide film (RTO: Rapid Thermal Oxidation) or the like. Single wafer epitaxial growth and vapor phase growth for an insulating film or the like using lamp heating can be included in the heat treatment using an RTP apparatus in a broad sense.

In the RTP treatment, as in the batch type heat treatment apparatus, a wafer support tool (may be called "a susceptor") for heat treatment is employed; therefore, a problem has remained unsolved that slip dislocations are easy to occur in contact portions of the wafer support tool with a wafer (see JP-A 2002-164300).

DISCLOSURE OF THE INVENTION

The present invention has been made in order to solve the above problem and it is an object of the present invention to provide a wafer support tool for heat treatment easy in working and capable of realizing reduction in cost without generating damages or slip dislocations that would be otherwise caused by high temperature heat treatment and a heat treatment apparatus.

In order to solve the problem, a wafer support tool for heat treatment of the present invention comprises: a plurality of wafer support members for supporting a wafer to be heat treated; and a support member holder for holding the wafer support members, wherein the wafer support members each has a contact portion with the wafer, at least one of the contact portions being movable relative to the support member holder.

A configuration of the contact portion is a curved surface convex against a wafer to be heat treated and especially preferably spherical or ellipsoidal. It is preferable that the wafer support member is a pin, the support member holder is a pin holder for holding the pin and the pin is fitted in a pinhole formed in the pin holder. The pin is preferably removable from the pin holder and preferably formed by working a cylindrical body. Raw material of the pin and the pin holder can be SiC, silicon or quartz. A plurality of pinholes is preferably provided and the pinhole is preferably slit-shaped. The slit-shaped pinholes are desirably provided radially from the center of the pin holder. The pin holder is preferably disc-shaped or ring-shaped and in a case where the pin holder is disc-shaped, a circular pinhole is formed in the center position thereof.

The wafer support member may comprise a rotatable body as the contact portion with the wafer to be heat treated, and the rotatable body is accommodated in a rotatable body accommodating hole formed in the wafer support member or the support member holder and rotatable by friction force with the wafer to be heat treated.

The rotatable body is preferably in the form of a sphere, an ellipsoid, a hollow cylinder or a solid cylinder. The rotatable body accommodating hole is desirably in the form of a slit groove and the rotatable body accommodating holes each in the form of a slit groove are preferably formed radially from the center of the support member holder. The support member holder is preferably disc-shaped or ring-shaped. Material of the rotatable body may be SiC, silicon or quartz.

The wafer support tool for heat treatment of the present invention may further comprise: support poles for holding the plural support member holders; and bases for holding the support poles. The support member holders may be preferably removable from the support poles. Material of the support poles and the bases may be SiC, silicon or quartz.

A heat treatment apparatus of the present invention has the wafer support tool for heat treat treatment of the present invention.

BRIEF DESCRIPTION OF THE DRAWINGS

FIGS. 3 (a), (b1) and (b2) are descriptive views showing how to make pins, wherein FIG. 3 (a) shows an example of a cylindrical pin body, FIG. 3 (b1) shows an example of a finished pin and FIG. 3 (b2) shows an example of another finished pin.

FIGS. 6 (a)-(d) are enlarged sectional views taken on line VI-VI of FIG. 2, wherein FIG. 6 (a) shows a state where a pin is in an upright position, FIG. 6 (b) shows a state where a pin is inclined toward the outer periphery, FIG. 6 (c) shows a state where a pin is inclined toward the center, and FIG. 6 (d) shows a state where an edge portion of a lower end of a pin is rounded.

FIGS. 9 (a) and (b) are descriptive side views showing essential parts of a third embodiment of a wafer support tool for heat treatment of the present invention, wherein FIG. 9 (a) shows an example of a state where a wafer is supported and FIG. 9 (b) shows a state where the wafer in the state of FIG. 9 (a) is extended to rotate a rotatable body, which is a wafer support member.

FIGS. 10 (a), (b) and (c) are top views of rotatable bodies with various shapes, which are wafer support members, wherein FIG. 10(a) shows a sphere, FIG. 10(b) shows an ellipsoid and FIG. 10(c) shows a solid cylinder or a hollow cylinder.

FIGS. 11(a) and 11(b) are descriptive side views showing essential parts of a fourth embodiment of a wafer support tool for heat treatment of the present invention, wherein FIG. 11(a) shows an example of a state where a wafer is supported and FIG. 11(b) shows a state where the wafer is extended to rotate a rotatable body, which is a wafer support member.

FIGS. 14(a) and 14(b) are a descriptive view and a photograph of Example 2, wherein

FIGS. 15(a) and 15(b) are a descriptive view and a photograph of Comparative Example 1, wherein

FIGS. 16(a) and 16(b) are a descriptive view and a photograph of Example 3, wherein FIG. 16 (a) is a top view of the wafer support tool for heat treatment used in Example 3 and FIG. 16(b) is a photograph showing a result of observation with X-ray topography of the heat treated wafer.

BEST MODE FOR CARRYING OUT THE INVENTION

Description will be given of embodiments of the present invention below based on the accompanying drawing and it is needless to say that examples shown in figures are presented by way of illustration only and various modifications or alterations thereof can be implemented as far as not departing from the technical concept of the present invention.

Figure 1:
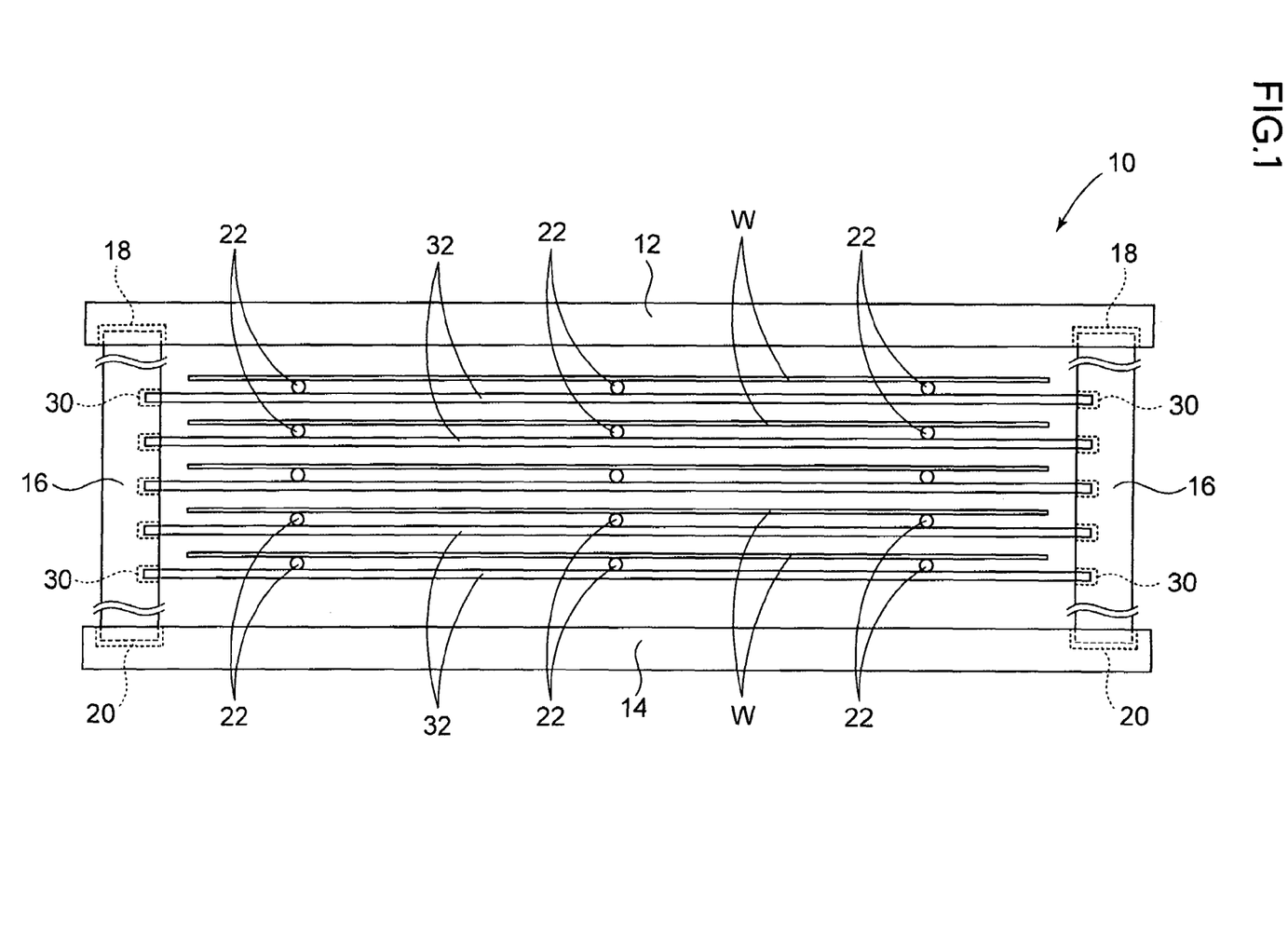
FIG. 1 is a descriptive side view showing a first embodiment of a wafer support tool for heat treatment of the present invention.

In FIG. 1, reference numeral 10 designates a wafer support tool for heat treatment pertaining to the present invention. The wafer support tool 10 includes: a pair of bases 12 and 14 provided opposite each other in a vertical direction; and plural support poles 16 (3 poles in FIG. 2) provided vertically between the bases 12 and 14.

The upper end and lower end of the support pole 16 are fitted respectively in a receiving hole 18 bored on the lower surface of the upper base 12 and a receiving hole 20 bored on the upper surface of the lower base 14 so that the support pole 16 is removably held with the bases 12 and 14.

Figure 3:
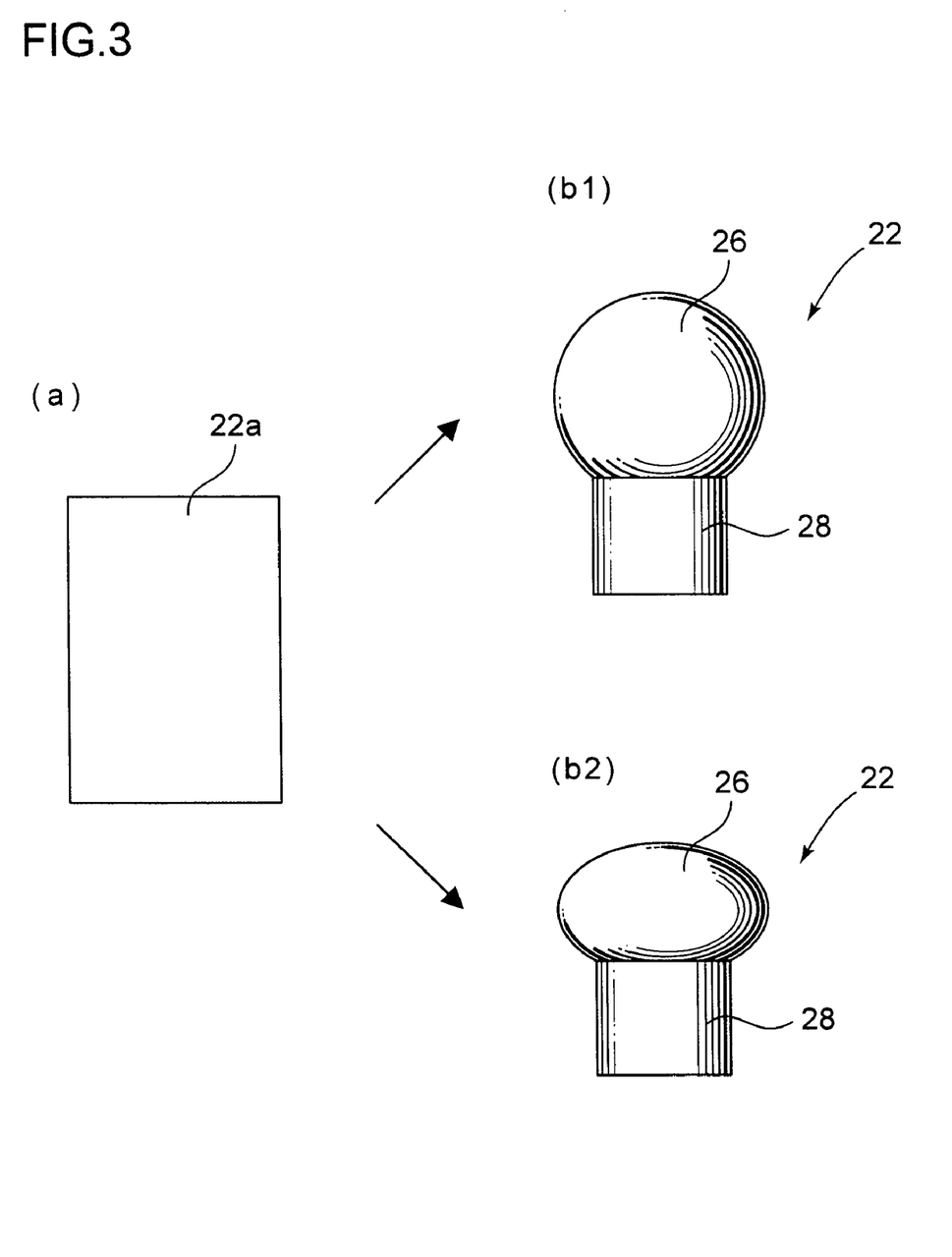

Reference numeral 22 designates a pin as a wafer support member used for supporting a wafer W to be heat treated. The pin 22 is, as shown in FIG. 3(b1) or 3(b2), provided with a contact section 26 for supporting a wafer W at the distal end thereof and provided with a fitting portion 28 at the proximal end thereof.

Figure 7:
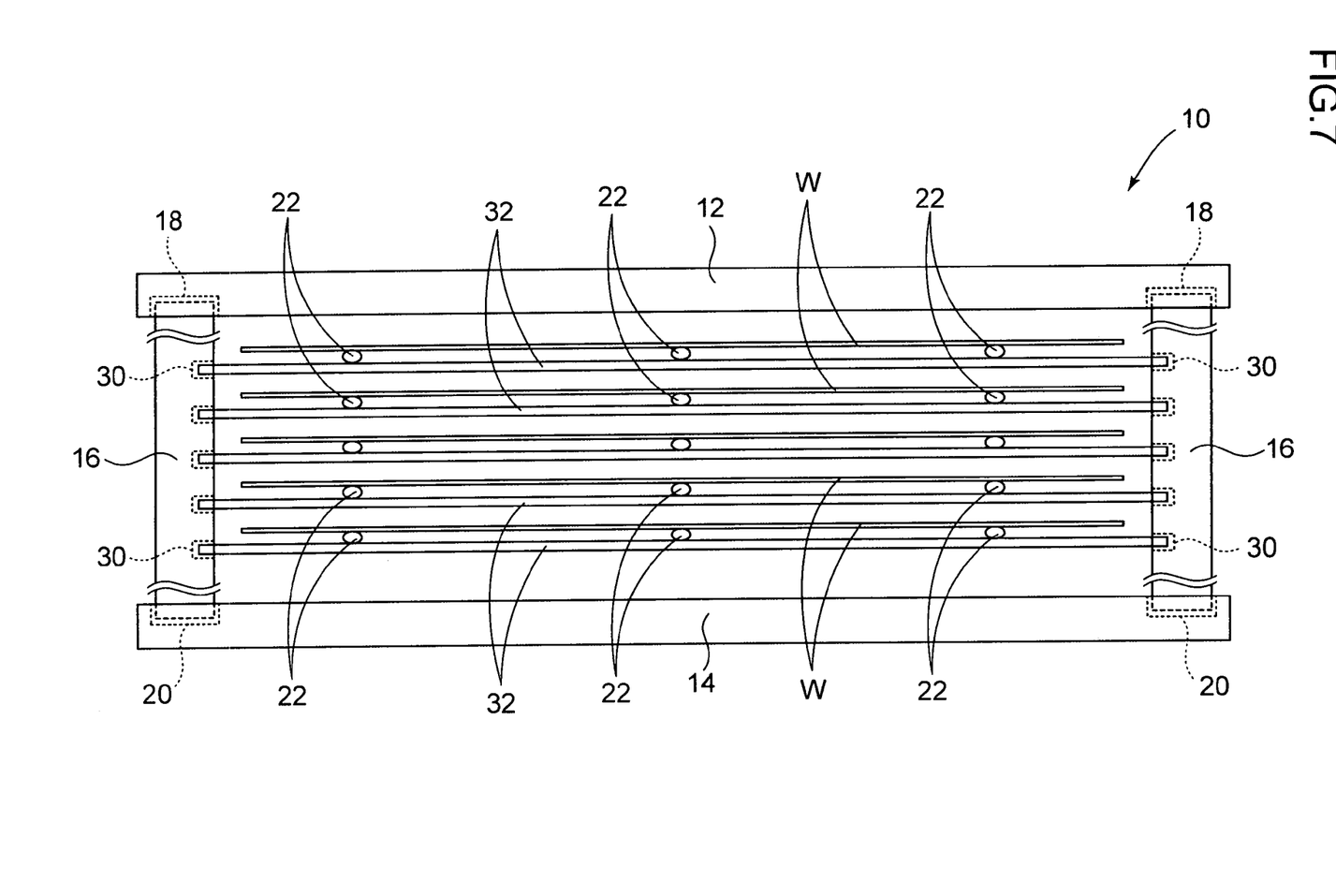
FIG. 7 is a descriptive side view showing a second embodiment of a wafer support tool for heat treatment of the present invention.

A shape of the contact section 26 of the pin 22 is preferably a curved surface convex toward the wafer W to be supported. In the embodiments shown in FIG. 1, FIG. 2 and FIG. 3(b1), there are shown cases where the shapes of the contact sections 26 are spherical. No specific limitation is imposed on the shape of the contact section 26 and any of shapes other than a sphere can be adopted as far as the shape is, as described above, a curved surface convex toward the wafer W to be supported and the contact section 26 can also be in the shape of an ellipsoid, which is shown in the second embodiment of FIG. 3(b2) and FIG. 7. Incidentally, in FIG. 7, a difference from FIG. 1 is only the shape of the pin 22 and the repetitive description of the structure is omitted. In FIG. 7, the same symbols are used to the same members as or the members similar to those in FIG. 1.

Insert grooves 30 are formed on the side surfaces of the support poles 16 at the same heights. Reference numeral 32 designates pin holders as support member holders removably supporting the pins 22 and no limitation is imposed on a shape of the pin holders and in FIGS. 2 and 4, there are shown cases of discs. The pin holders 32 are inserted into the insert grooves 30 and thereby the pin holders 32 are removably inserted and held in the poles 16. The pin holders 32 are, as shown in FIGS. 2 and 4, in the shape of a disc and besides, can also be, as shown in FIG. 8, formed in the shape of an annulus with an opening 33 in the central portion.

Figure 2:
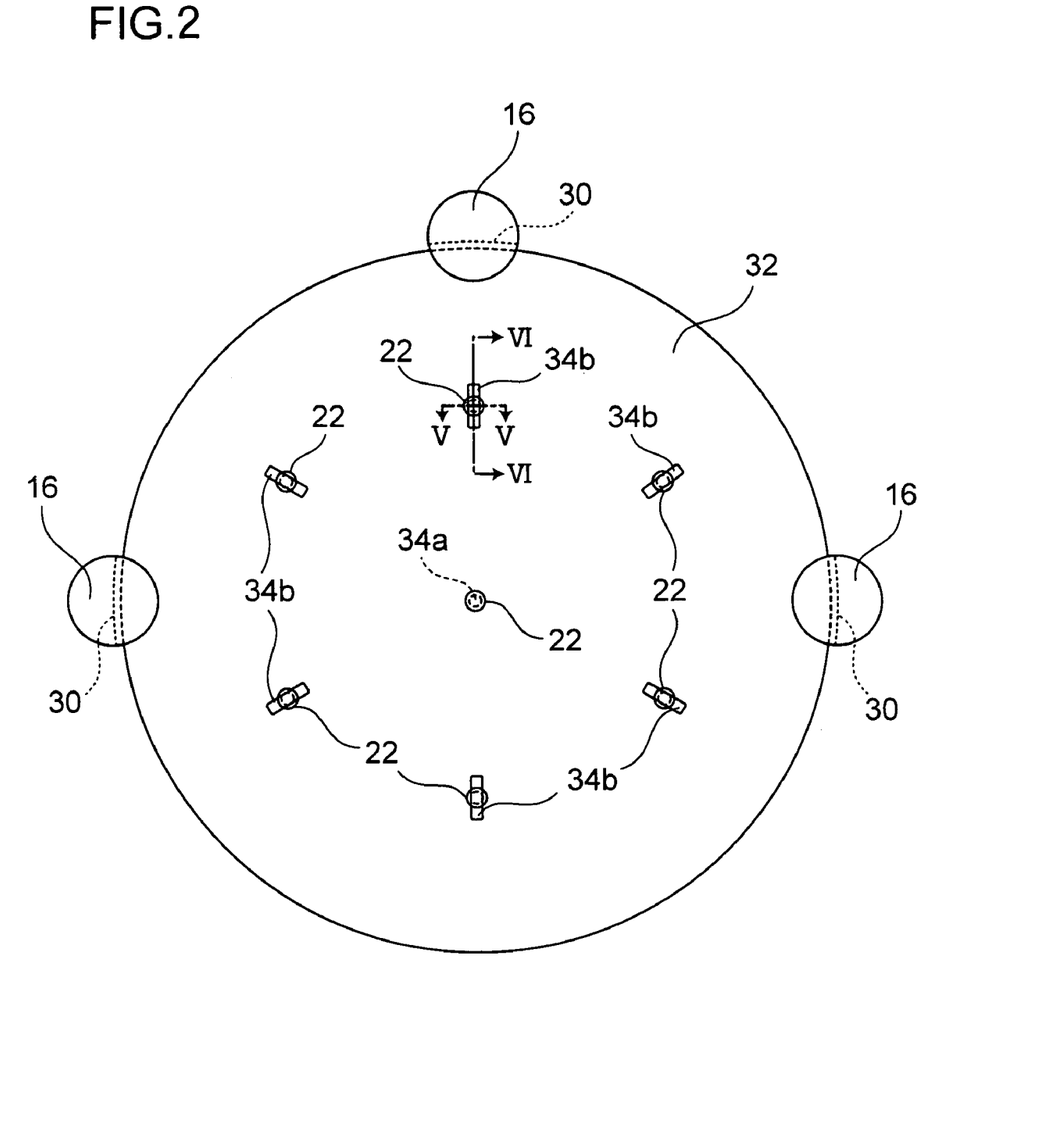
FIG. 2 is a descriptive top view showing a state where an upper base and an uppermost wafer are removed from the structure of FIG. 1.
Figure 4:
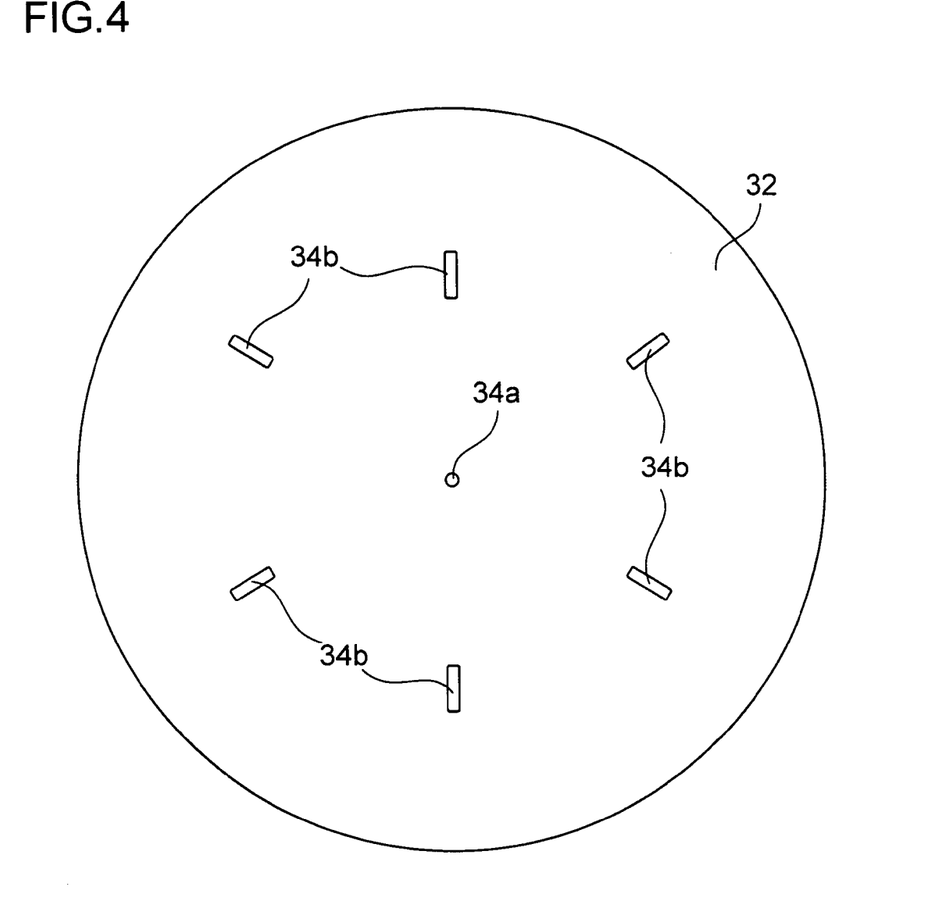
FIG. 4 is a top view showing a structural example of a pin holder used in a wafer support tool for heat treatment of the present invention.
Figure 5:
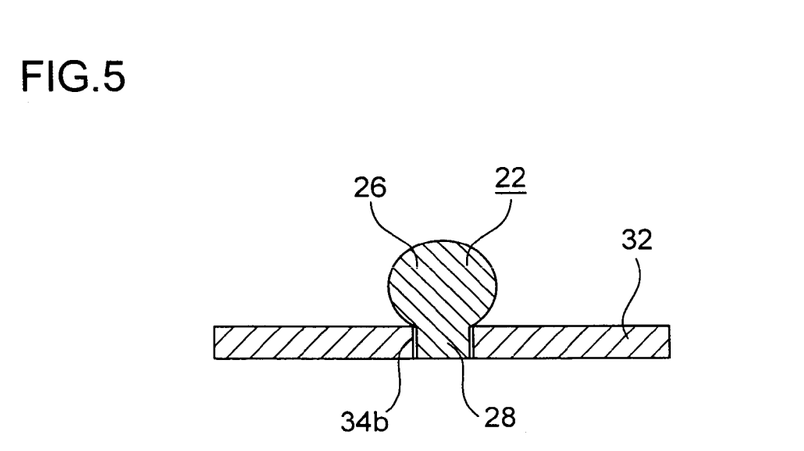
FIG. 5 is an enlarged sectional view taken on line V-V of FIG. 2.
Figure 6:
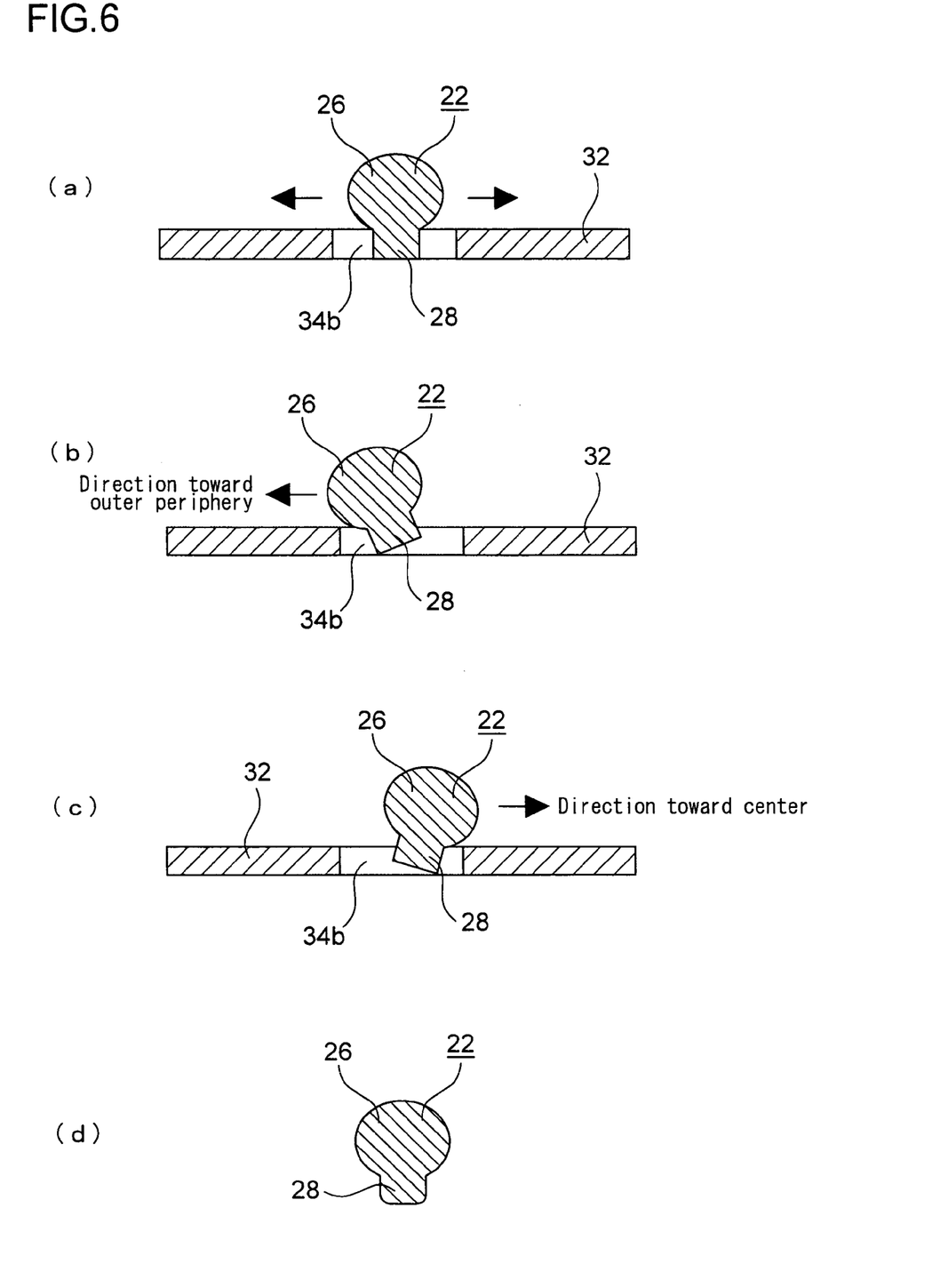

A circular fitting hole 34a and slit-like fitting holes 34b are, as shown in FIGS. 2 and 4, bored on the disc-like pin holder 32 corresponding to the fitting portions 28 of the pins 22. A fitting hole (a pinhole) may be either a through hole or a hole with the bottom. The fitting portion 28 is fitted into the circular fitting hole 34a formed in the central portion of the disc-like pin holder 32 and thereby the pin 22 is removably held by the disc-like pin holder 32. The pins 22 fitted in the slit-like fitting holes 34b formed radially from the center of the disc-like pin holder 32 can be moved relative to the disc-like pin holder 32 by a value of the order of several mm in a direction in which a wafer is extended or contracted during a heat treatment process, that is in a direction toward the outer periphery from the center of the disc-like pin holder 32 (FIG. 6(b)) or in a direction opposite it, that is in a direction toward the center (FIG. 6(c)) so as to alleviate stress generated at a contact plane between the pin 22 and the wafer W by a motion of the wafer in the direction in which the wafer is extended or contracted during the heat treatment process. In this case, it is preferable to form a round called "R" on the peripheral edge of the lower end of the fitting portion 28, as shown in FIG. 6(d), in order to facilitate a motion of the pin 22.

Figure 8:
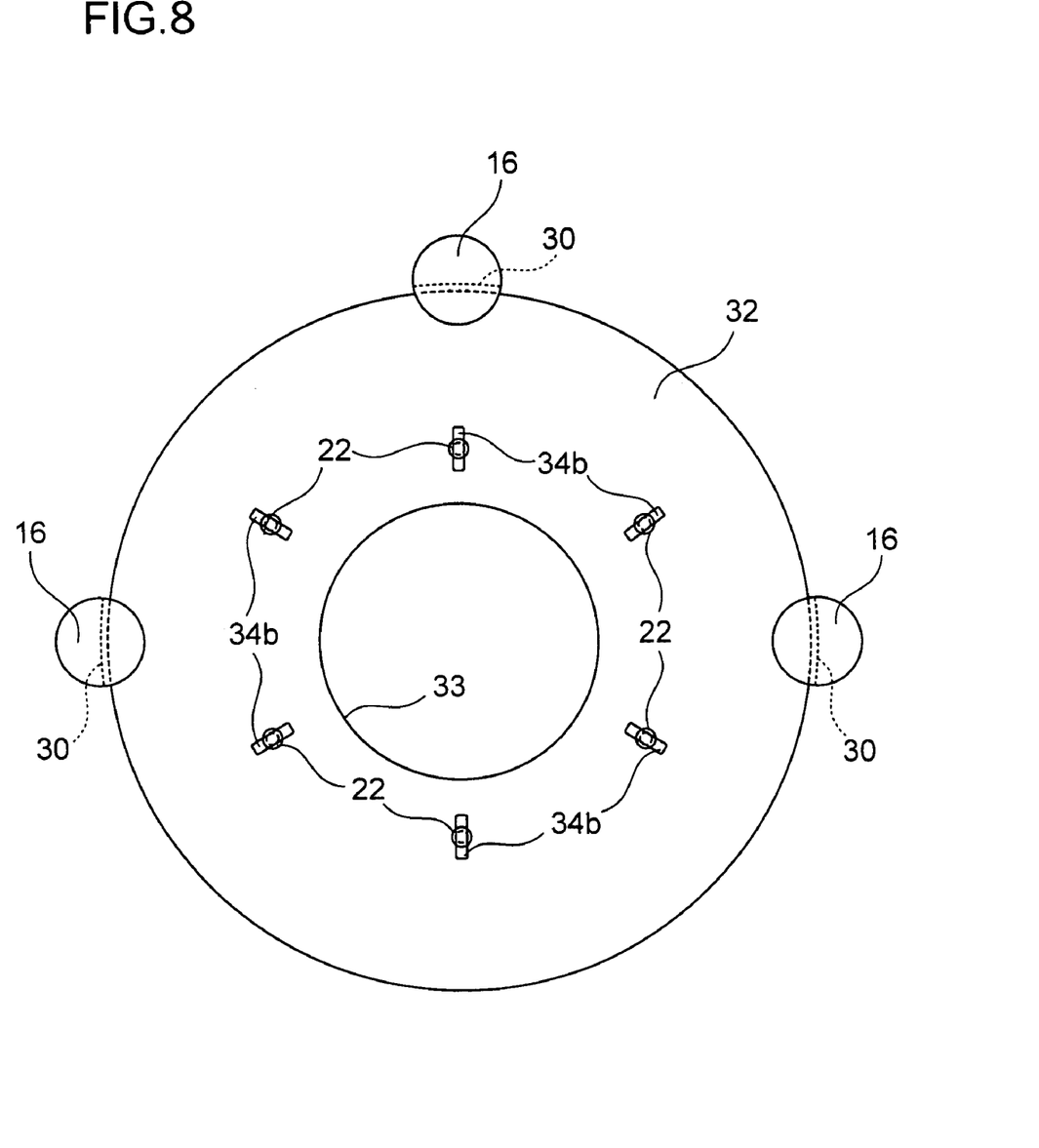
FIG. 8 is a top view showing an example of another structure of a pin holder used in a wafer support tool for heat treatment of the present invention.

In the embodiments shown in FIGS. 2, 4 and 8, there are shown cases where the three support poles 16 are provided, while no specific limitation is placed on the number of the support poles 16 as far as the bases 12 and 14 can be supported by the support poles 16.

The pin 22 can be, as shown in FIGS. 3(a), 3(b1) and 3(b2), easily obtained by grinding a pin body 22a in the shape of a cylinder with a lathe and surface roughness of the pin, especially, the contact section 26, can be easily controlled. The pin body 22a is made of SiC, Si (single crystal or polycrystal) or quartz in the shape with a diameter of the order in the range of from 1 to 7 mm and a length of the order in the range of from 5 to 10 mm. Raw material of the support pole 16 and the bases 12 and 14 may also be preferably SiC, silicon or quartz.

The circular fitting hole 34a formed in the central portion of the disc-like pin holder 32 shown in FIGS. 2 and 4 is in the shape of a circle with a diameter of the order in the range of from 1 to 7 mm and the slit-like fitting holes 34b formed radially from the center of the pin holder 32 are in the shape with a width of the order in the range of from 1 to 7 mm and a length of the order in the range of from 4 to 21 mm. The slit-like fitting holes 34b in number of the order in the range of from 3 to 24 sites are arranged radially from the center of the pin holder 32 with length directions of the slits in alignment with radii (6 sites in FIGS. 2 and 4). In a case where the pin holder 32 is in the shape of an annulus as shown in FIG. 8, the fitting hole 34a formed at the central portion of the pin holder 32 is naturally omitted but in a case where the pin holder 32 is in the shape of a disc as shown in FIG. 4 as well, the fitting hole 34a may be omitted.

In a wafer support tool of the present invention, as described above, since the shape of the contact portion of the distal end of the pin with the wafer is formed so as to be curved surface convex toward the wafer, neither damages nor slip dislocations occur at the contact portion with the wafer during heat treatment so that productivity may be improved to achieve cost reduction.

Surface roughness of the contact portion 26 of the pin 22 with the wafer W may also be adjusted to a desirable value only by additionally working the surface of the contact portion 26. Besides, by appropriately selecting the shapes of the pins 22 and the fitting holes 34a, 34b, positions on the wafer W in contact with the pins 22 (in-plane positions on the wafer W) and shapes of the contact portions 26 may be freely designed. In a case where only the pins 22 can be removed from the pin holder 32, cleaning and exchange of the pins may be easy and the surfaces of the pins may also be reworked for recycling.

In the embodiments, while a structure is shown in which the pins are removably held by the pin holder 32 with the fitting hole 34a, 34b; the pin holders 32 are removably held by the support pole 16 with the insert grooves 30; and the support poles 16 are removably held by the bases 12, 14 with the receiving holes 18 and 20. If necessary, another structure may also be adopted in which the pins 22 are irremovably fixed on the pin holder 32, the pin holders 32 are irremovably fixed to the support poles 16 and the support poles 16 are irremovably fixed to the bases 12, 14.

In the embodiments shown in FIGS. 1 to 8, while there is shown a case where the pins 22 are used as the wafer support members, it is also possible to use members other than the pins 22 as wafer support members, of which description will be given below based on FIGS. 9(a) to 11(b).

In FIGS. 9(a) and 9(b), reference numeral 40 designates a wafer support member holder, which constitutes a wafer support tool for heat treatment according to the present invention. The support member holder 40 holds the wafer support members 42. The wafer support member 42 has a trapezoidal member 44 arranged on the upper surface of the support member holder 40. A rotatable body accommodating hole 46 is bored on the upper surface of the trapezoidal member 44. The rotatable body 48 as a contact portion with a wafer W to be heat treated is rotatably fitted in the rotatable body accommodating hole 46. An arrow mark 50 shows a given position of the rotatable body 48. No specific limitation is imposed on a shape of the rotatable body 48, and there can be adopted shapes such as a sphere of FIG. 10(a), an ellipsoid of FIG. 10(b) and a hollow cylinder or a solid cylinder of FIG. 10(c) as viewed from above.

With the construction above described, when the wafer W is, as shown in FIG. 9(a), heat treated in a state where the wafer W is supported by the rotatable body 48 while being in contact therewith, the wafer W is extended in a direction of extension thereof shown by an arrow mark 52 and the rotatable body 48 rotate as shown in FIG. 9(b), which is clear from a position of the arrow mark 50; therefore, it can be suppressed that damages or slip dislocations occur in the contact portion of the wafer W with the rotatable body during heat treatment.

Incidentally, in the embodiment of FIGS. 9(a) and 9(b), the rotatable body accommodating hole 46 is bored on the upper surface of the trapezoidal member 44, while another construction can be adopted in which the rotatable body accommodating hole 46 is bored directly on the upper surface of the support member holder 40 with omitting the trapezoidal member 44 and the rotatable body 48 is fitted directly into the rotatable body accommodating hole 46. Still another construction may be adopted in which the trapezoidal member 44 may be replaced with a member having another shape different from the trapezoidal one.

Figure 9:
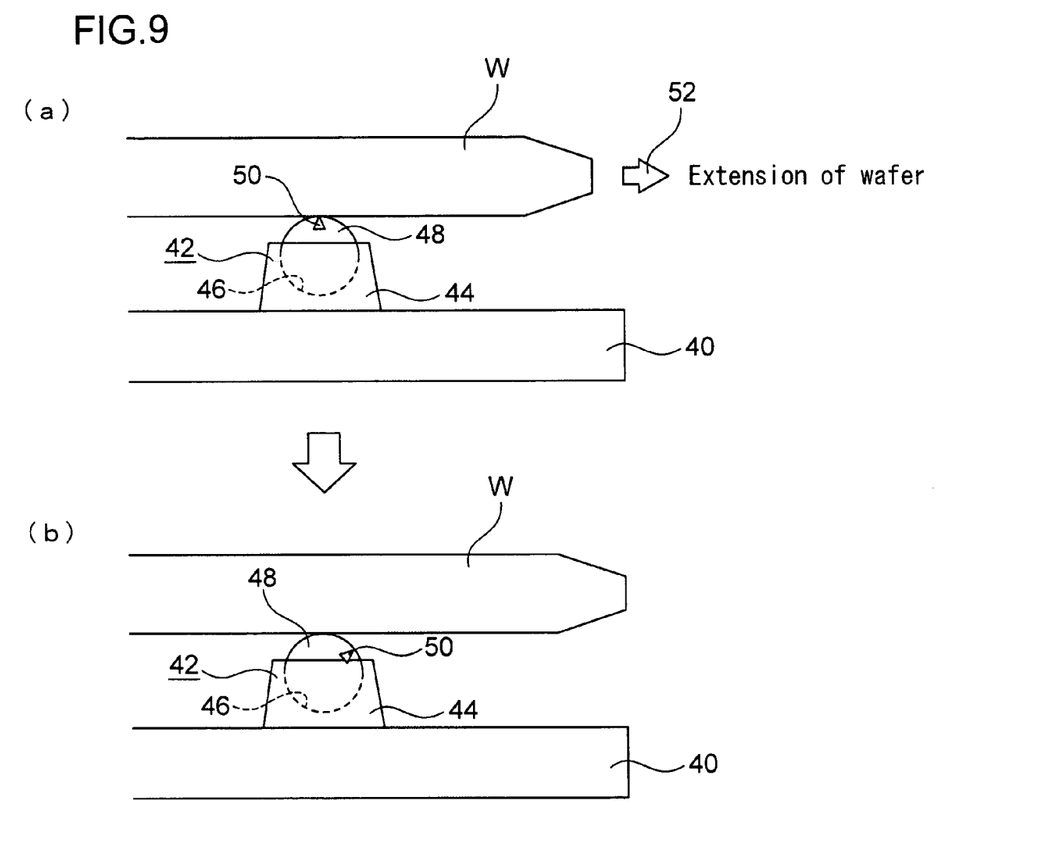
Figure 10:
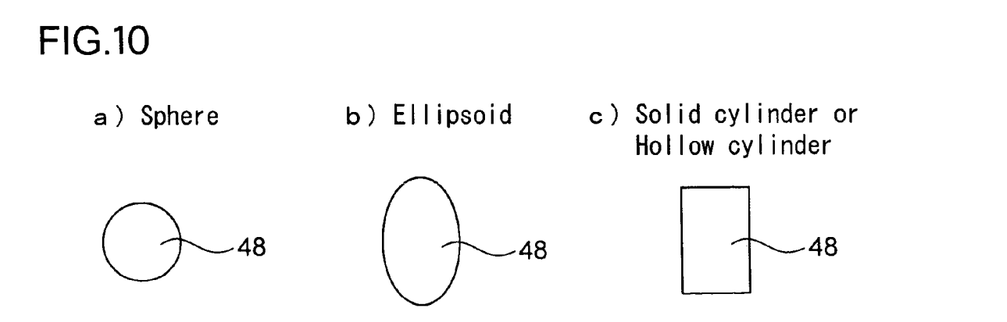
Figure 11:
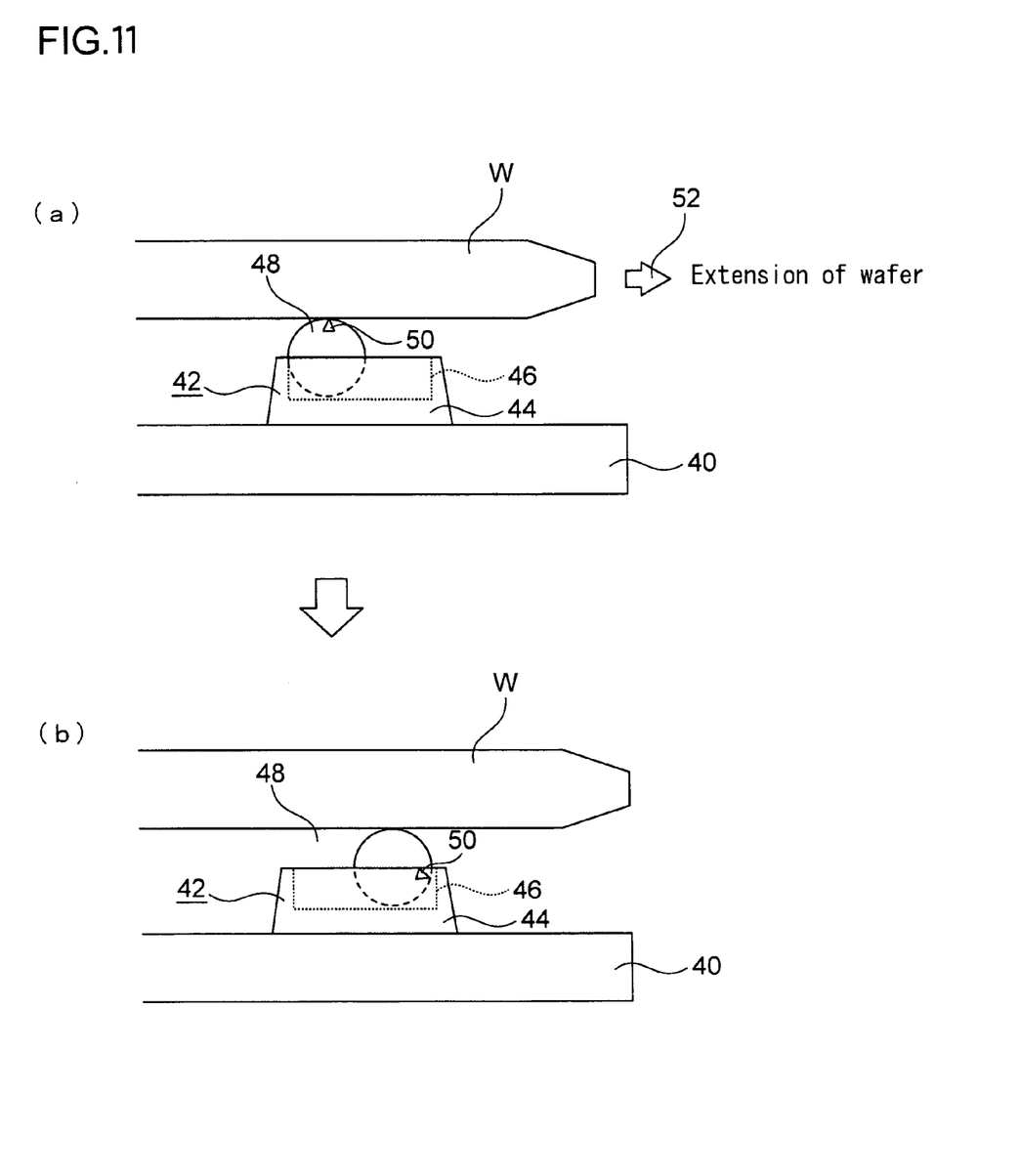

In the embodiment of FIGS. 9(a) and 9(b), there is shown the case where the rotatable body 48 is fitted in the rotatable body accommodating hole 46 on the trapezoidal member 44, while yet another construction can also be adopted in which the shape of the rotatable body accommodating hole 46 is formed in the shape of a slit groove, as shown in FIGS. 11(a) and 11(b) and the rotatable body 48 is accommodated in the slit-like rotatable body accommodating hole 46 so as to be rotatable therein and movable therealong. In this case, slit groove-like rotatable body accommodating holes 46 are preferably disposed radially from the center of the support member holder 40. With the construction adopted, when the wafer W is subjected to heat treatment in a state where the wafer W is supported in contact with the rotatable body 48, the wafer W is, as shown in FIG. 11(a), extended in a direction of extension shown with an arrow mark 52 and the rotatable body 48 rotates as shown in FIG. 11(b), as is clear from the position of the arrow mark 50; therefore, it can be suppressed, as in the case of FIG. 9, that damages or slip dislocations occur in the contact portion of the wafer W with the rotatable body during heat treatment. Especially, in the construction of FIGS. 11(a) and 11(b), since rolling of the rotatable body 48 is used, rolling friction in this case is extremely small, which exerts a great effect of preventing generation of damages or slip dislocations caused by the friction.

Incidentally, in the embodiment of FIGS. 11(a) and 11(b) as well, the slit groove-like rotatable body accommodating hole 46 is bored on the trapezoidal member 44, while a construction can also be adopted in which the slit groove-like rotatable body accommodating hole 46 is bored directly on the upper surface of the support member holder 40 with omitting the trapezoidal member 44 and the rotatable body 48 is accommodated directly in the slit groove-like rotatable body accommodating hole 46 so as to be rotatable therein and movable therealong.

A heat treatment apparatus of the present invention is a heat treatment apparatus with a wafer support tool for heat treatment of the present invention exemplified in the first to fourth embodiments.

Figure 12:
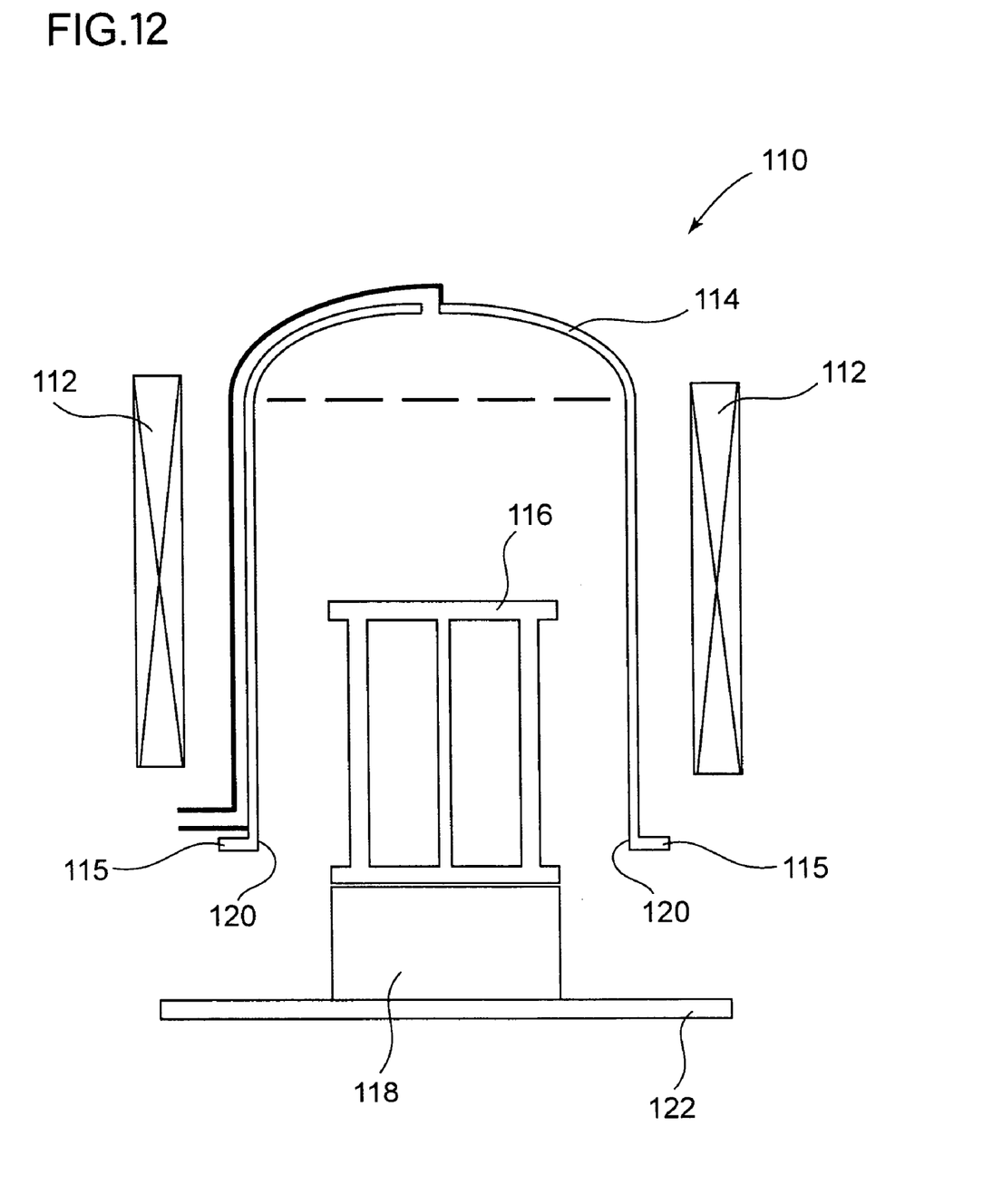
FIG. 12 is a descriptive schematic view showing an embodiment of a vertical heat treatment furnace.

As the heat treatment apparatus of this kind, there has been known, for example, a vertical heat treatment furnace as shown in FIG. 12. In the figure, reference numeral 110 designates a vertical heat treatment furnace. The heat treatment furnace 110 comprises: a heater 112 arranged concentrically; a process tube 114 disposed inside thereof; a boat 116 on which plural wafers are placed; a heat insulating cylinder 118 on which the boat 116 is mounted in a freely removable manner; a cover 122 arranged on the lower end of the heat insulating cylinder 118 and closing a furnace opening 120 at the lower end of the process tube 114 during heat treatment; and a vertically moving means not shown moving upward or downward the boat 116, the heat insulating cylinder 118 and the cover 122 toward the interior of the process tube 114. Reference numeral 115 is a flange provided at the lower end of the process tube 114. By applying the wafer support tool for heat treatment of the present invention to the above boat 116, the vertical heat treatment furnace 110 can be used as the heat treatment furnace of the present invention.

Figure 13:
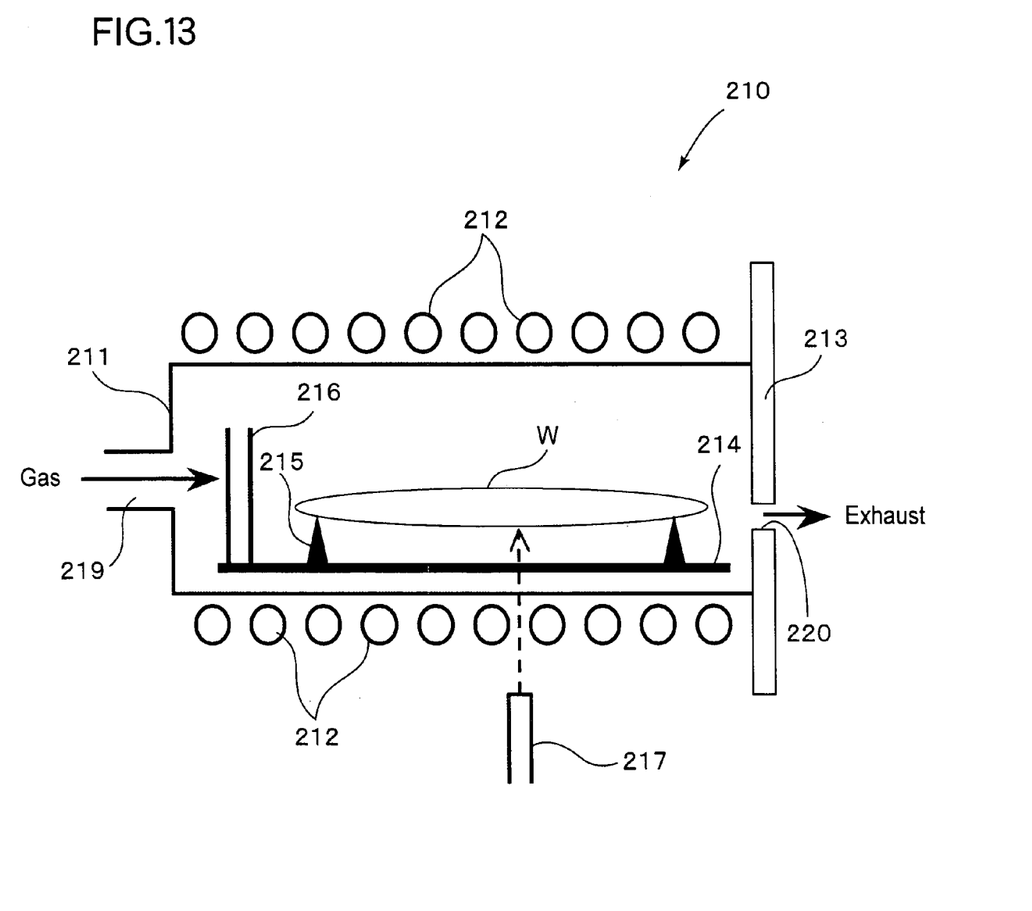
FIG. 13 is a descriptive schematic view of an embodiment of an RTP apparatus.

A rapid heating and rapid cooling (RTP) apparatus can also be used as the heat treatment apparatus of this kind. Description will be given of an embodiment of the RTP apparatus with reference to FIG. 13. FIG. 13 is a descriptive schematic view of an embodiment of the RTP apparatus. In FIG. 13, reference numeral 210 designates a heat treatment apparatus, in other word, an RTP apparatus. The heat treatment apparatus 210 has a chamber 211 made from quarts and a wafer W is heat treated in the chamber 211. The heat treatment is carried out by heating lamps 212 surrounding the chamber 211 externally, above and below, and left and right. In the heating lamps 212, supply of power can be individually controlled.

A gas introduction port 219 is provided on the gas introduction side of the chamber 211, while an auto shutter 213 is installed on the gas exhaust side to thereby seal off the outside air. A wafer insert port not shown that can be opened or closed with a gate valve is formed in the auto shutter 213. A gas exhaust port 220 is formed in the auto shutter 213 so that an atmosphere in the furnace is adjustable.

The wafer W is placed on a three-point supporter 215 formed on a support tool, for example, a quartz tray 214. A buffer 216 made of quarts is provided on the gas introduction port side of the quartz tray 214 and a gas introduced through the gas introduction port 219 can be prevented from blowing directly to the wafer W.

A special window for measuring a temperature not shown is formed in the chamber 211 and a temperature of the wafer W can be measured with a pyrometer 217 installed outside the chamber 211 through the special window.

In the RTA apparatus 210, a wafer support tool for heat treatment of the present invention is applied instead of a wafer support tool, for example the quartz tray 214, thereby enabling the RTA apparatus 210 to be used as the heat treatment apparatus of the present invention.

Description will be given of the present invention showing examples in a more concrete way and it is needless to say that the examples are presented by way of illustration only but should not be construed by way of limitation.

EXAMPLE 1

SiC was used as material of bases, support poles and pins to fabricate a wafer support tool for heat treatment described in FIGS. 1 and 2. In this case, each of the pins was prepared in a way such that a cylindrical body with a diameter of about 5 mm and a length of 10 mm was used, a contact section in the shape of a sphere with a diameter of about 5 mm was formed at the distal end thereof and a diameter of the proximal end thereof was worked to about 3 mm. Six slit-like pinholes provided radially were formed so that the central portions thereof were disposed at positions of 110 mm from the center of the pin holder.

Such a wafer support tool for heat treatment was used to conduct heat treatment of a CZ silicon single wafer with a diameter of 300 mm, a crystal orientation of <100>, a conductivity type of p-type and a resistivity of about 10 Ωcm. Investigation was conducted about a state of occurrence of damages or slip dislocations in a contact portion with the wafer.

Conditions for the heat treatment were in an atmosphere of 100% argon at 1200° C. for 1 hr and the temperature for loading and unloading the wafer was 700° C.

The heat treated wafer was almost free from occurrence of damages or slip dislocations as a result of investigation with X-ray topography thereabout in the contact portion of the wafer with the wafer support tool.

EXAMPLE 2

Figure 14:
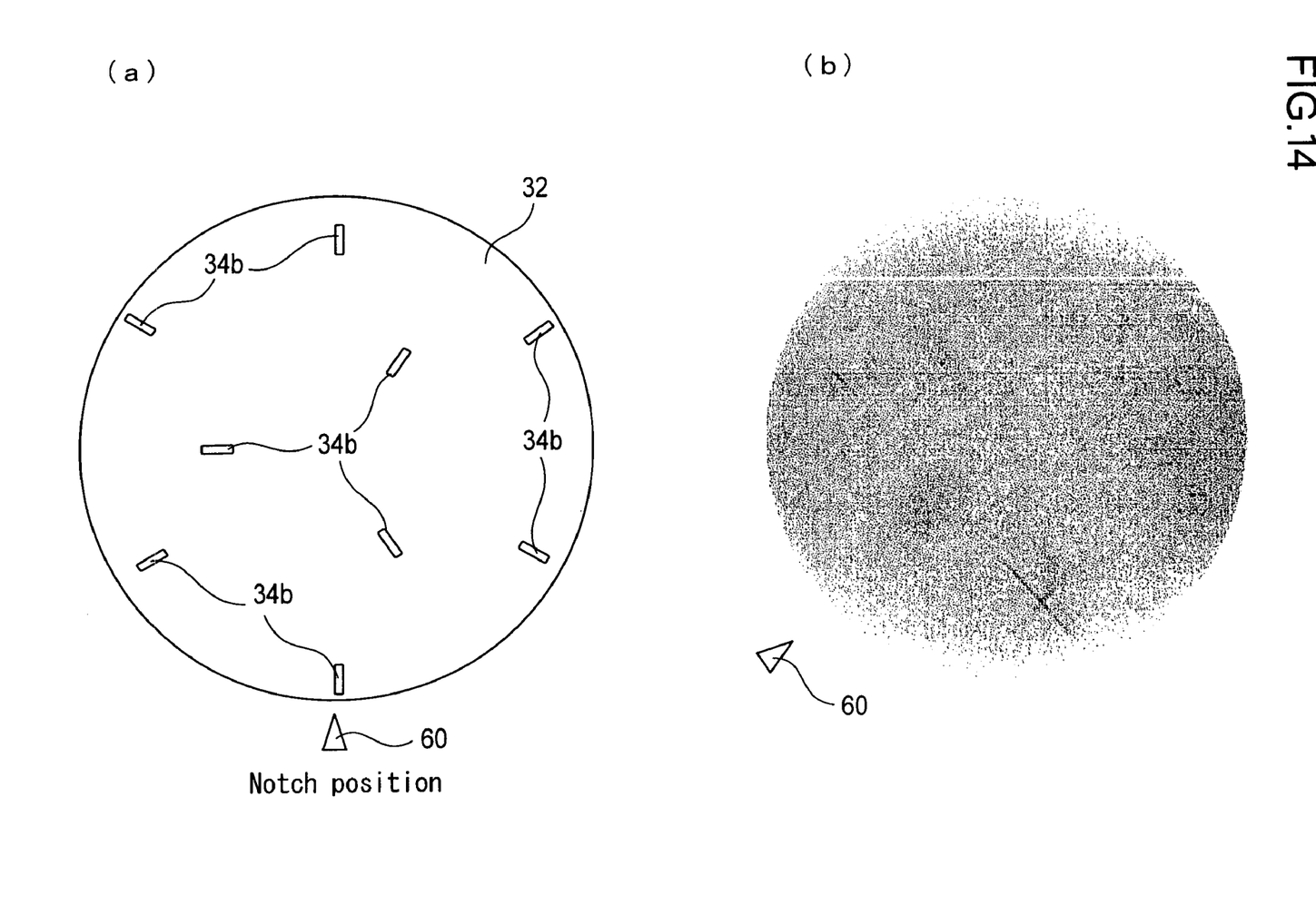
FIG. 14(a) is a top view of the wafer support tool for heat treatment used in Example 2 and FIG. 14(b) is a photograph showing a result of observation with an X-ray topography of the heat treated wafer.

SiC was used as material of bases, support poles and pins to fabricate a wafer support tool for heat treatment as described in FIG. 1. The pin holder 32 had a diameter of 320 mm and a thickness of 1 mm, and nine slits 34b, each of which was a through hole with a width of 3.5 mm and a length of 9 mm and into each of which a pin was fitted, were formed radially on the pin holder 32, as shown in FIG. 14(a), wherein arrangement was such that three slits at positions 140 mm in radius at an angular spacing of 120 degrees, another set of three slits at positions 120 mm in radius at an angular spacing of 120 degrees and still another set of three slits at positions 60 mm in radius at an angular spacing of 120 degrees, and movable pins were inserted into all the nine slits 34b. In this case, each of the pins was formed from a cylindrical body having a diameter of 8 mm and a length of 10 mm, and a spherical contact section having a diameter of about 6 mm was formed at the distal end thereof, while the proximal end had a diameter of about 3 mm. A total of the nine contact areas between the pins and the wafer were 10 mm$^2$ or less.

Such a wafer support tool for heat treatment was used to heat treat a CZ silicon single crystal wafer with a diameter of 300 mm, a crystal orientation of <100>, a conductivity type of a p-type and resistivity of about 10 Ω cm, followed by investigation about a state of occurrence of slip dislocations in the contact portion with the wafer.

Conditions for heat treatment were in a mixed gas atmosphere of argon and oxygen, at 1350° C., and for 8 hr, assuming a high temperature, long time heat treatment for preparation of an SIMOX wafer, and the temperature for loading and unloading the wafer was 600° C. Incidentally, SIMOX (Separation by Ion-implanted Oxygen) is one of methods for preparing an SOI (Silicon On Insulator) wafer, in which oxygen ions are implanted into a silicon single crystal wafer and then the implanted wafer is heat treated to thereby form an $SiO_2$ layer in the interior of the silicon single crystal wafer. The heat treated wafer was observed with X-ray topography and in FIG. 14(b), there are shown results of the observation. In FIG. 14(b), almost no-occurrence of slip dislocations was observed despite extremely severe conditions for heat treatment of 1350° C. and 8 hr. Incidentally, in FIGS. 14(a) and 14(b), reference numeral 60 designates an arrow mark indicating a notch position.

COMPARATIVE EXAMPLE 1

Figure 15:
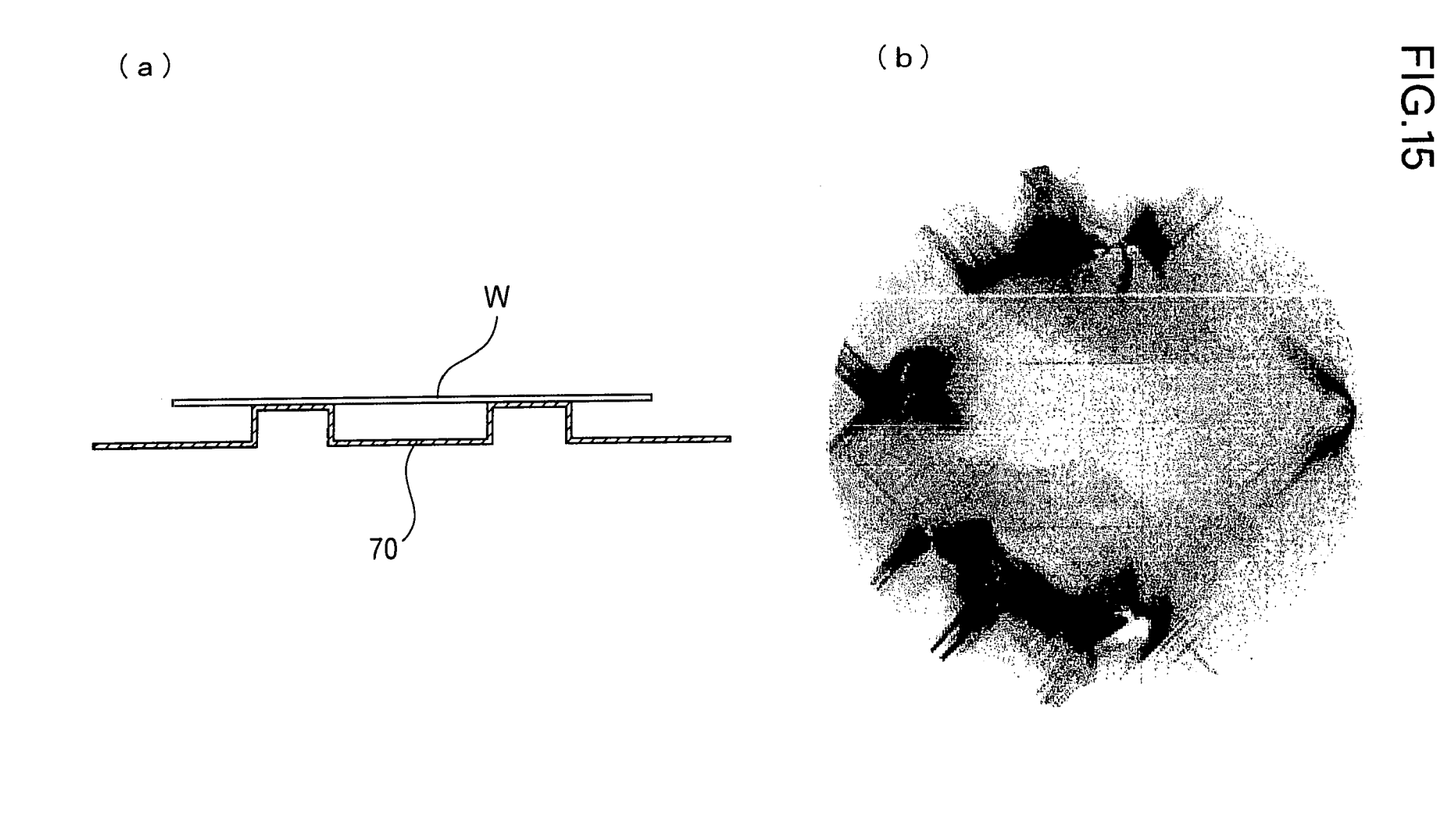
FIG. 15(a) is a descriptive sectional view showing a state where a wafer is placed on the wafer holder used in Comparative Example 1 and FIG. 15(b) is a photograph showing a result of observation with X-ray topography of the heat treated wafer.

A conventional wafer holder 70 as shown in FIG. 15(a) (a contact portion of a wafer is in the shape of a ring and a contact area is about 25000 mm²) was used, a wafer W of the same specifications as in Example 2 was used, heat treatment was conducted in the same conditions as in Example 2 and X-ray topography was used to observe slip dislocations thereof, results of which are shown in FIG. 15 (b).

It is found that many of slip dislocations, as is clear from FIG. 15(b), occurred in a case where the conventional wafer holder was used. Comparing the results shown in FIG. 15(b) and FIG. 14(b), the difference between them is conspicuous and it is understood that the slip resistant characteristic of the wafer support tool of the present invention was very high.

EXAMPLE 3

Figure 16:
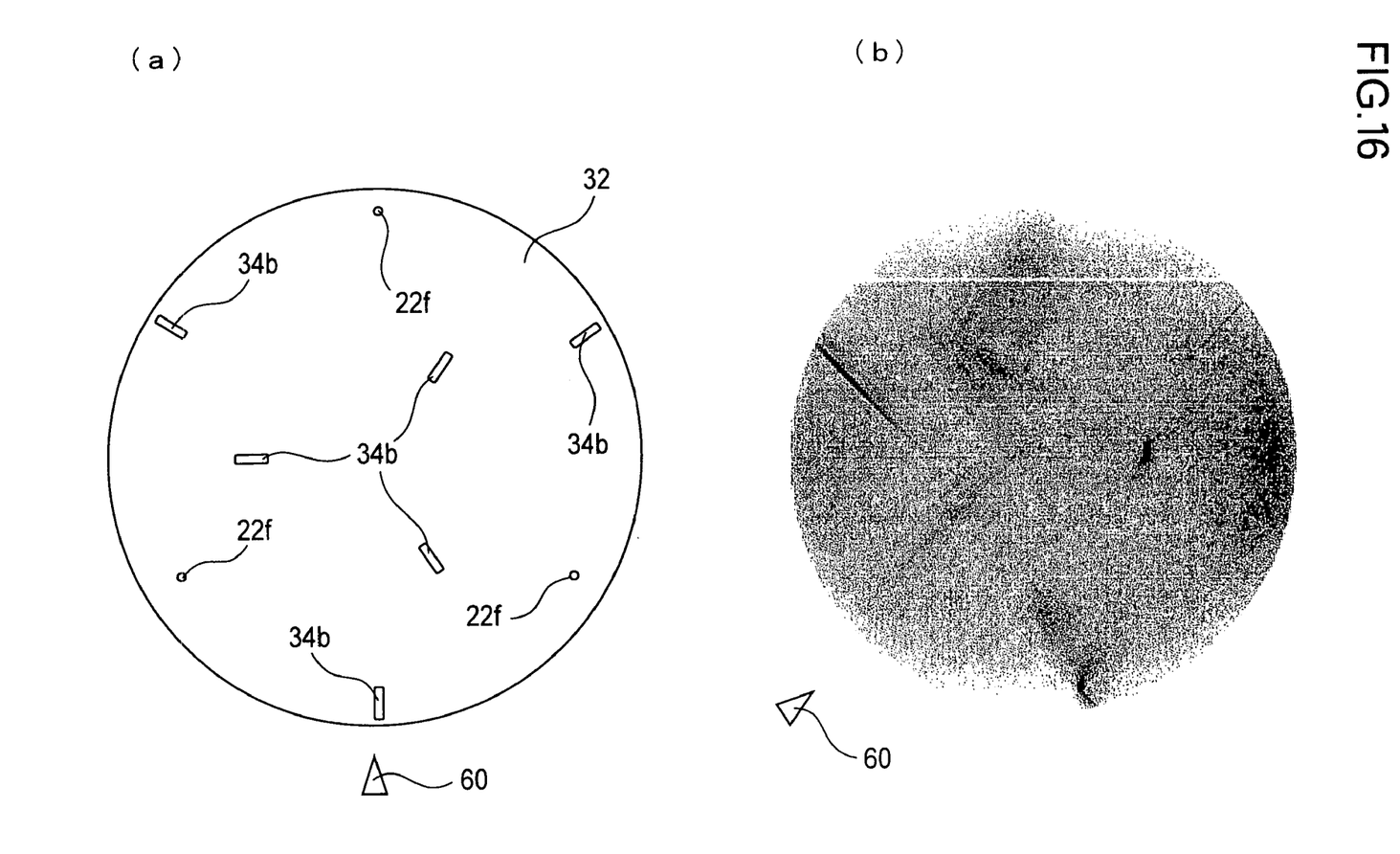

In order to confirm an effect of movable pins, there was separately prepared a pin holder in which only pins at three sites 120 mm in radius with an angular spacing of 120 degrees were fixed as fixed pins 22f in the pin holder 32 used in Example 2 (FIG. 16(a)) with which heat treatment was conducted in the same conditions as in Example 2 and slip dislocations were observed with X-ray topography, results of which are shown in FIG. 16(b). In FIGS. 16(a) and 16(b), reference numeral 60 designates an arrow mark indicating a position of a notch of a wafer.

According to FIG. 16(b), occurrence of some slip dislocations were observed as compared with FIG. 14(b) in which the nine movable pins were used and it was found that the occurrence of the slip dislocations coincides with the positions of the fixed pins. Therefore, it was confirmed that movability in the contact portions between the wafer support member and the wafer has an effect of suppressing the slip dislocations.

Thus, by making the contact portions between the wafer support tool and the wafer movable, an effect of suppressing slip dislocations can be obtained, and hence an effect of reducing slip dislocations according to the present invention can be secured if at least part of the contact portions are made movable as in Example 3, as compared with a case where all the contact portions are fixed as in the conventional support tool. It is naturally the most effective that all the contact portions are made movable.

CAPABILITY OF EXPLOITATION IN INDUSTRY

As described above, by conducting heat treatment of a wafer using the wafer support tool for heat treatment of the present invention, damages or slip dislocations caused by high temperature heat treatment can be effectively suppressed and the wafer support tool for heat treatment of the present invention is easy to be worked, so that the wafer support tool of the present invention exerts a great effect that reduction in fabrication cost can be realized. Especially, the wafer support tool for heat treatment of the present invention has high effectiveness in heat treatment at a high temperature for a long time as in a case of a SIMOX wafer.

According to the heat treatment apparatus of the present invention equipped with the above mentioned wafer support tool for heat treatment, there can be provided a wafer with less of damages or slip dislocations after high temperature heat treatment and hence it is possible to improve quality and yield of devices to be fabricated using the wafer.

The invention claimed is:

1. A wafer support tool for heat treatment comprising:
    a support member holder in a form of a flat panel and having a central location point and a flat upper surface, the support member holder extending radially from the central location point, the support member holder having a plurality of slit-shaped pinholes formed into the upper surface, disposed apart from the central location point in a radial direction, angularly spaced apart from one another and extending radially relative to the central location point; and
    a plurality of wafer support members, each one of the plurality of wafer support members having a fitting portion sized to be slidably received in a respective one of the plurality of slit-shaped pinholes and a contact portion integrally connected to the fitting portion and sized to contact and project upwardly from the upper surface of the support member holder when respective ones of the fitting portions are slidably received in respective ones of the plurality of slit-shaped pinholes.

2. The wafer support tool for heat treatment according to claim 1, wherein a configuration of the contact portion is a curved surface convex against the wafer to be heat treated.

3. The wafer support tool for heat treatment according to claim 1, wherein a configuration of the contact portion is spherical or ellipsoidal.

4. The wafer support tool for heat treatment according to claim 1, wherein each one of the plurality of the wafer support members is a pin and the support member holder is a pin holder for holding the plurality of pins.

5. The wafer support tool for heat treatment according to claim 4, wherein the pin is removable from the pin holder.

6. The wafer support tool for heat treatment according to claim 4, wherein the pin is formed by working a cylindrical body.

7. The wafer support tool for heat treatment according to claim 4, wherein raw material of the pin and the pin holder is SiC, silicon or quartz.

8. The wafer support tool for heat treatment according to claim 4, wherein the pin holder is disc-shaped or ring-shaped.

9. The wafer support tool for heat treatment according to claim 8, wherein the pin holder is disc-shaped and a circular pinhole is formed in the central location position thereof.

10. The wafer support tool for heat treatment according to claim 1, further comprising: support poles for holding a plurality of support member holders; and bases for holding the support poles.

11. The wafer support tool for heat treatment according to claim 10, wherein the support member holders are removable from the support poles.

12. The wafer support tool for heat treatment according to claim 10, wherein material of the support poles and the bases is SiC, silicon or quartz.

13. A heat treatment apparatus having the wafer support tool for heat treatment according to claim 1.

14. The wafer support tool for heat treatment according to claim 1, wherein each one of the plurality of slit-shaped pinholes is rectangularly shaped and has a width extending perpendicularly relative to the radial direction, the width of each one of the plurality of slit-shaped pinholes is at least substantially uniform.

15. The wafer support tool for heat treatment according to claim 1, wherein each one of the plurality of wafer support members is operative to tilt when received in a respective one of the plurality of slit-shaped pinholes such that, when the fitting portion tilts towards the central location point, the contact portion tilts away from the central location point and, when the fitting portion tilts away from the central location point, the contact portion tilts towards the central location point.

* * * * *